(12) United States Patent
Badillo et al.

(10) Patent No.: US 8,441,288 B2
(45) Date of Patent: May 14, 2013

(54) DIFFERENTIAL CURRENT SIGNAL CIRCUIT

(75) Inventors: Dean A. Badillo, Chandler, AZ (US); David R. LoCascio, Chandler, AZ (US)

(73) Assignee: Sand 9, Inc., Cambridge, MA (US)

( * ) Notice: Subject to any disclaimer, the term of this patent is extended or adjusted under 35 U.S.C. 154(b) by 150 days.

(21) Appl. No.: 13/089,859

(22) Filed: Apr. 19, 2011

(65) Prior Publication Data

US 2012/0268169 A1 Oct. 25, 2012

(51) Int. Cl.
*H02M 11/00* (2006.01)

(52) U.S. Cl.
USPC ............................................. 327/103; 363/73

(58) Field of Classification Search .................. 327/103, 327/512, 513, 538–543; 363/73; 323/265, 323/268, 269
See application file for complete search history.

(56) References Cited

U.S. PATENT DOCUMENTS

| | | | | |
|---|---|---|---|---|
| 5,068,621 A | * | 11/1991 | Hayward et al. | 330/253 |
| 5,963,064 A | * | 10/1999 | Toyota et al. | 327/103 |
| 6,566,961 B2 | * | 5/2003 | Dasgupta et al. | 330/301 |
| 7,688,146 B2 | * | 3/2010 | Kao et al. | 330/301 |
| 8,320,149 B2 | * | 11/2012 | Tang et al. | 365/63 |

OTHER PUBLICATIONS

Wyszynski, A.; , "High-frequency linear tunable single-ended voltage to differential current converter," Circuits and Systems, 1995., Proceedings., Proceedings of the 38th Midwest Symposium on , vol. 2, no., pp. 897-900 vol. 2, Aug. 13-16, 1995.*

* cited by examiner

*Primary Examiner* — Patrick O Neill
(74) *Attorney, Agent, or Firm* — Schmeiser, Olsen & Watts LLP

(57) ABSTRACT

A differential current signal circuit is described which includes a voltage to differential current converter circuit that generates a differential pair of current output signals in response to receiving a voltage input signal, where the differential pair of current output signals are linearly proportional to the voltage input signal within a voltage operating range from a minimum operating voltage to a maximum operating voltage. The differential pair of current output signals are linear over a wide range of voltage input signals. A correction circuit is included which eliminates voltage offsets in the voltage operating range due to process and temperature variations. The correction circuit also provides the capability to adjust the minimum operating voltage, and eliminates variations in the minimum operating voltage due to process and temperature variations.

24 Claims, 12 Drawing Sheets

DIFFERENTIAL CURRENT SIGNAL CIRCUIT

BACKGROUND OF THE INVENTION

1. Technical Field

This invention relates generally to electronic circuits and in particular to a circuit which provides a differential pair of current signals.

2. State of the Art

In some electronic devices it is desirable to implement a current signal, where the level of current is adjustable throughout a range of current levels. In some designs a differential pair of current output signals is desirable. Using a differential pair of signals provides a circuit with greater dynamic range and noise immunity. It is also desirable in some situations to have a current output signal which is linearly proportional to an input voltage signal throughout a voltage range. This allows the output current level to be accurately adjusted over time by adjusting the input voltage range.

A resistor circuit can be used to create a current signal that is linearly proportional to a voltage, but this does not fulfill the need for a differential pair of current output signals that are linearly proportional to an input voltage. A pair of source-coupled transistors can be used to create a differential pair of current output signals, but the differential pair of current output signals have a relatively small voltage operating range over which they are linearly related to the input voltage. Thus it is desirable to have an electronic circuit which generates a differential pair of current output signals that are linearly related to an input voltage signal within a wide range of input voltages.

Additionally, it is desirable to generate the differential pair of current output signals with a circuit that provides a repeatable and stable level of output current regardless of process or temperature variations. In some circuits the voltage operating range is offset from its desired values due to process and temperature variations. In other circuits the variation in the resistance value of a resistor due to process or temperature variations can cause variations in the amplitude of output signals. Voltage offset and/or variations in signal output can cause the system that the electronic circuit is a part of to become unstable or to change states or levels undesirably. Thus it is desirable to have an electronic circuit that outputs a differential pair of current output signals that are linearly proportional to a voltage input signal, where the signal output levels are stable over process and temperature variations.

DISCLOSURE OF THE INVENTION

The disclosed invention relates to electronic circuits and in particular to a circuit which generates a differential pair of current signals, also referred to as a differential pair of current output signals. The electronic circuit according to the invention converts a voltage input signal into a differential pair of current output signals, where the differential pair of current output signals are linearly proportional to the voltage input signal over a voltage operating range that covers a wide range of input voltages, and where the differential pair of current output signals have reduced susceptibility to process and temperature variations.

An electronic circuit is disclosed which includes a voltage to single-ended current converter circuit, where the voltage to single-ended current converter circuit outputs a single-ended current signal in response to receiving a voltage input signal, and where the single-ended current signal is linearly proportional to the voltage input signal. The electronic circuit according to the invention also includes a single-ended current to differential current converter circuit, where the single-ended current to differential current converter circuit outputs a differential pair of current output signals in response to receiving the single-ended current signal. The differential pair of current output signals are linearly proportional to the voltage input signal within a voltage operating range from a minimum operating voltage to a maximum operating voltage. In some embodiments the voltage to single-ended current converter circuit includes a voltage to linear current feedback loop circuit, where the voltage to linear current feedback loop circuit generates an interim current signal in response to receiving the voltage input signal, and where the interim current signal is linearly proportional to the voltage input signal, and where the voltage to linear current feedback loop circuit generates a current replication voltage in response to receiving the voltage input signal. In some embodiments the voltage to single-ended current converter circuit includes a current replication transistor, wherein the current replication transistor generates a single-ended current signal in response to receiving the current replication voltage, wherein the single-ended current signal is linearly proportional to the voltage input signal.

In some embodiments the electronic circuit according to the invention includes a correction circuit, where the correction circuit outputs a set minimum operating voltage signal in response to receiving a correction input voltage, and where the minimum operating voltage is adjusted in response to adjusting the set minimum operating voltage signal. In some embodiments the single-ended current to differential current converter circuit includes a load mirror circuit, where the load mirror circuit outputs a load-mirrored voltage signal in response to receiving the single-ended current signal. In some embodiments the single-ended current to differential current converter circuit according to the invention includes a voltage to differential current converter circuit, where the voltage to differential current converter circuit outputs the differential pair of current output signal in response to receiving the load-mirrored voltage signal. In some embodiments the differential pair of current output signals are linearly proportional to the single-ended current signal over the voltage operating range in response to an impedance of the load mirror transistor being linearly proportional to an impedance of a load receiving a first end of the differential pair of current output signals. In some embodiments the voltage to differential current converter circuit includes a second feedback amplifier, where the second feedback amplifier outputs a second feedback amplifier output signal in response to receiving the load-mirrored voltage signal, and a source-coupled amplifier circuit which outputs the differential pair of current output signals in response to receiving the second feedback amplifier output signal.

An electronic circuit is disclosed which includes a correction circuit, where the correction circuit outputs a tracking bias signal in response to receiving a correction input voltage. The electronic circuit according to the invention also includes a voltage to differential current converter circuit with a converter resistor, where the voltage to differential current converter circuit outputs a first end and a second end of a differential pair of current output signals in response to receiving a voltage input signal, and where the first and the second end of the differential pair of current output signals are linearly proportional to the voltage input signal within a voltage operating range from a minimum operating voltage to a maximum operating voltage, where voltage offsets in the voltage operating range are eliminated in response to the voltage to differential current converter circuit receiving the tracking bias signal. In some embodiments the correction circuit further comprises a tracking bias resistor, where the amplitude of the tracking bias signal is a function of the resistance value of the tracking bias resistor. In some embodiments the correction circuit further comprises a set minimum operating voltage transistor, where the set minimum operating voltage transistor outputs a set minimum operating voltage signal in response to receiving the tracking bias signal. In some embodiments the minimum operating voltage of the voltage to differential current converter circuit is adjusted in response to adjustments to the set minimum operating voltage signal.

An electronic circuit is disclosed which includes a correction circuit, where the correction circuit outputs a set minimum operating voltage signal in response to receiving a correction input voltage. The electronic circuit also includes a voltage to differential current converter circuit, where the voltage to differential current converter circuit outputs a first end and a second end of a differential pair of current output signals in response to receiving a voltage input signal, and where the first and the second end of the differential pair of current output signals are linearly proportional to the voltage input signal throughout a voltage range from a minimum operating voltage to a maximum operating voltage. The minimum operating voltage is adjusted in response to adjustments to the set minimum operating voltage signal. In some embodiments the voltage to differential current converter circuit comprises a converter resistor, and variations in the minimum operating voltage of the voltage to differential current converter circuit due to variations in the resistance value of the converter resistor are eliminated in response to a first end of the converter resistor receiving the set minimum operating voltage signal.

A method of generating a differential pair of current signals is disclosed which includes the step of providing a single-ended current signal to a load mirror circuit, where the load mirror circuit outputs a load-mirrored voltage signal in response to receiving the single-ended current signal, and where the load-mirrored voltage signal is a nonlinear function of the single-ended current signal. The method also includes the step of generating a differential pair of current signals from the load-mirrored voltage signal, where a first end of the differential pair of current signals is linearly proportional to the single-ended current signal within an operating range from a minimum current level to a maximum current level. In some embodiments the first end of the differential pair of current signals is linearly proportional to the single-ended current signal within an operating range from a minimum current level to a maximum current level in response to an impedance of the load mirror circuit being linearly proportional to an impedance of a load circuit as seen by the first end of the differential pair of current signals. In some embodiments the method also includes the step of providing the first end of the differential pair of current signals to a first load transistor. In some embodiments the method of generating a differential pair of current signal according to the invention also includes the step of providing a second end of the differential pair of current signals to a second load transistor, where the first load transistor, the second load transistor, and the load mirror circuit have the same impedance. In some embodiments the method includes the step of generating a single-ended current signal with a voltage to single-ended current converter circuit, where the voltage to single-ended current converter circuit generates the single-ended current signal in response to receiving a voltage input signal, and where the single-ended current signal is linearly proportional to the voltage input signal within a voltage operating range from a minimum operating voltage to a maximum operating voltage. In some embodiments the method also comprises the step of generating a tracking bias signal with a correction circuit, where voltage offsets in the voltage operating range are eliminated in response to the voltage to single-ended current converter circuit receiving the tracking bias signal. In some embodiments the correction circuit further comprises a tracking bias resistor, where the amplitude of the tracking bias signal is a function of the resistance value of the tracking bias resistor. In some embodiments the correction circuit outputs a set minimum operating voltage signal, where the minimum operating voltage of the voltage to single-ended current converter circuit is adjusted in response to adjustments to the set minimum operating voltage signal.

A method of generating a differential pair of current signals is disclosed which includes the steps of generating a first single-ended current signal that is linearly proportional to a voltage input signal using a first feedback loop, and duplicating the first single-ended current signal to create a second single-ended current signal. The method according to the invention also includes the step of generating a load-mirrored voltage signal from the second single-ended current signal using a load mirror circuit, wherein the load-mirrored voltage signal is nonlinearly proportional to the second single-ended current signal. The method of generating a differential pair of current output signals according to the invention also includes the step of generating a first end of a differential pair of current signals from the load-mirrored voltage signal using a second feedback loop, where the first end of the differential pair of current signals is linearly proportional to the voltage input signal within a voltage operating range from a minimum operating voltage to a maximum operating voltage. In some embodiments the impedance of the load mirror circuit is the same as the impedance of a first load transistor, and the first load transistor receives the first end of the differential pair of current signals. In some embodiments the method also includes the step of generating a second end of the differential pair of current signals, where the second end of the differential pair of current signals has a phase that is shifted 180 degrees with respect to a phase of the first end of the differential pair of current signals. In some embodiments the method includes the step of generating a set minimum operating voltage signal, wherein the minimum operating voltage is adjusted in response to adjusting the set minimum operating voltage signal. In some embodiments the first feedback loop includes a converter resistor, and variations in the minimum operating voltage due to variations in the resistance value of the converter resistor are neutralized in response to the first feedback loop circuit receiving the set minimum operating voltage signal.

An electronic circuit according to the invention is disclosed which includes a load mirror circuit, where the load mirror circuit converts a single-ended current signal into a load-mirrored voltage signal according to a current-to-voltage transfer function. The electronic circuit according to the invention also includes a voltage to differential current converter circuit, wherein the voltage to differential current converter circuit converts the load-mirrored voltage signal to a first end of a differential pair of current output signals according to a voltage-to-current transfer function, wherein the voltage-to-current transfer function is inversely proportional to the current-to-voltage transfer function. In some embodiments the current-to-voltage transfer function is nonlinear. In some embodiments the first end of the differential pair of current signals is linearly proportional to the single-ended current signal. In some embodiments the voltage to differential current converter circuit converts the load-mirrored voltage signal into a second end of the differential pair of current signals, wherein the second end of the differential pair of current signals has a phase that is shifted 180 degrees from a phase of the first end of the differential pair of current signals. In some embodiments the electronic circuit according to the invention also includes a voltage to single-ended current converter circuit. The voltage to single-ended current converter circuit includes a voltage to linear current feedback loop circuit and a current replication transistor. The voltage to linear current feedback loop circuit generates an interim current signal in response to receiving a voltage input signal, where the interim current signal is linearly proportional to the voltage input signal. The voltage to linear current feedback loop circuit also generates a current replication voltage in response to receiving the voltage input signal. The voltage to single-ended current converter circuit according to the invention also includes a current replication transistor. The current replication transistor generates the single-ended current signal in response to receiving the current replication voltage, where the single-ended current signal is linearly proportional to the voltage input signal.

The foregoing and other features and advantages of the present invention will be apparent from the following more detailed description of the particular embodiments of the invention, as illustrated in the accompanying drawings.

DETAILED DESCRIPTION OF EMBODIMENTS OF THE INVENTION

As discussed above, embodiments of the present invention relate to electronic circuits and in particular to an electronic circuit which provides a differential pair of current output signals. The electronic circuit according to the invention converts a voltage input signal into a differential pair of current output signals, where the differential pair of current output signals are linearly proportional to the voltage input signal over a voltage operating range that covers a wide range of input voltages, and where the differential pair of current output signals have reduced susceptibility to process and temperature variations.

In some electronic devices it is desirable to convert a voltage signal into a current signal, with a linear relationship between the voltage input signal and the current output signal. Additionally, it is sometimes desirable to convert the voltage input signal into a differential pair of current signals. A differential signal pair includes a first end of the differential signal pair and a second end of the differential signal pair, where the first end and the second end of the differential pair of signals are 180 degrees out of phase with each other. In some situations modified differential signals are used, where the two ends are out of phase by some number of degrees other than 180 degrees. Differential signal pairs are used in electronic circuits to minimize noise levels, because noise that is picked up by both ends of the differential signal pair can be eliminated when the ends are subtracted to extract the signal.

Figure 1:
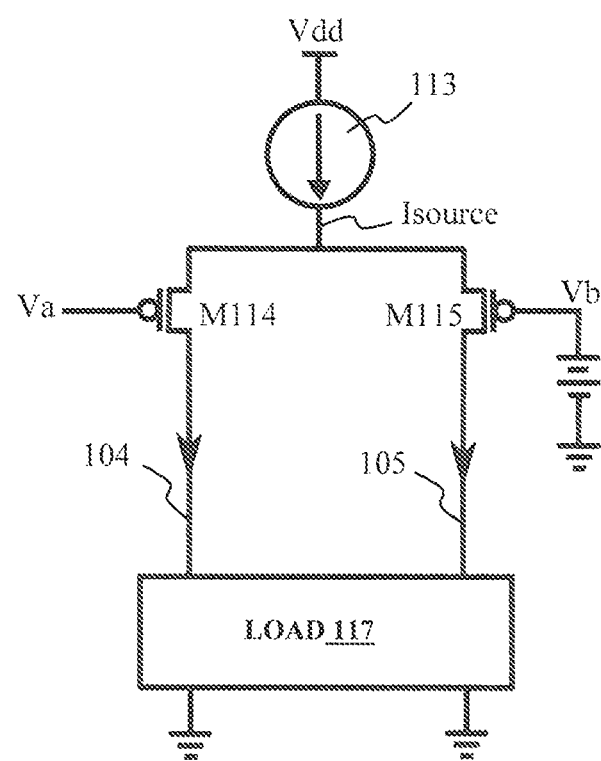
FIG. 1 is a schematic embodiment of a source-coupled amplifier circuit as is known in the art.
Figure 2:
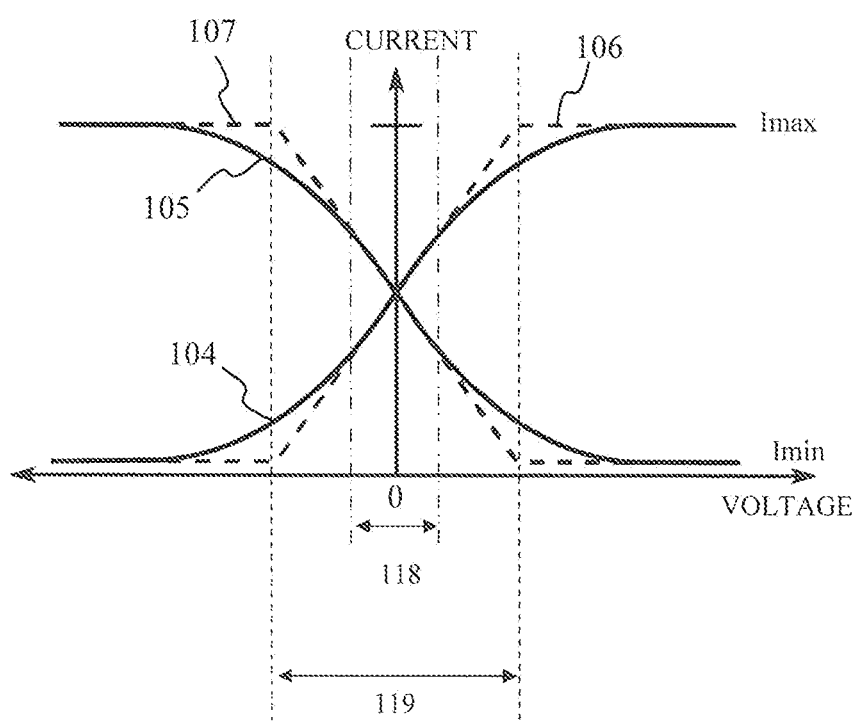
FIG. 2 shows the voltage-to-current transfer function of the source-coupled amplifier circuit of FIG. 1, indicated by solid lines 104 and 105, and a desired voltage-to-current transfer function indicated by dotted lines 106 and 107.

A pair of source-coupled transistors can be used to convert a voltage input signal into a differential pair of current output signals as shown in FIG. 1 and FIG. 2. FIG. 1 shows a schematic embodiment of a source-coupled amplifier circuit that can be used to convert a voltage input signal Va into a differential pair of current output signals 104 and 105. In this circuit current source 113 provides a current signal to transistors M114, and M115, which convert the voltage difference Va minus Vb into a differential pair of current output signals 104 and 105 that are delivered to load 117. FIG. 2 shows the voltage-to-current transfer function of the source-coupled amplifier circuit of FIG. 1, where line 104 represents the current vs. voltage response of the first end 104 of the differential pair of current output signals and line 105 represents the current vs. voltage response of the second end 105 of the differential pair of current output signals. In FIG. 2 the X-axis represents the voltage difference Va minus Vb and the Y-axis represents the output current level of differential pair of current output signals 104 and 105 resulting from the voltage input signal Va minus Vb. The issues with this circuit include that the linear operating range covers a relatively small range of input voltage values, and that the circuit is susceptible to voltage range offsets due to process variations and temperature variations.

Given the requirement that the current output signals are to be linearly proportional to the voltage input signal, the source-coupled amplifier circuit shown in FIG. 1 does not provide a very large voltage operating range. The voltage operating range is the range of input voltages within which the output signals have the desired characteristics. In this case the voltage operating range is that range of input voltages within which the current output signals are linearly proportional to the voltage input signal. The voltage operating range of the source-coupled amplifier circuit of FIG. 1 is indicated in FIG. 2 as voltage operating range 118. Within voltage operating range 118, the differential pair of current output signals 104 and 105 generated by the source-coupled amplifier circuit of FIG. 1 are linearly proportional to the input voltage. It is desirable to have a voltage-to-current transfer function that is linear within a larger operating range of input voltages. Line 106 and 107 indicate an improved voltage-to-current transfer function. The differential pair of current output signals indicated by line 106 and line 107 have a linear voltage operating range indicated by voltage operating range 119 in FIG. 2. Voltage operating range 119 provides a larger range of voltage input values that result in current outputs signals that are linearly proportional to the voltage input signal. In some instances resistors are added to the source-coupled amplifier circuit of FIG. 1, which partially linearizes the transfer function, but also adds an undesirable voltage drop into the circuit, and increases the susceptibility of the circuit to variations in output levels due to process and temperature variations.

There are other issues with the voltage-to-current transfer function represented by line 104 and line 105 as shown in FIG. 2. It is desirable to move the transfer curve along the voltage axis such that the minimum operating voltage is a positive voltage and so that the entire voltage operating range is a range of positive voltages. Also, it is desirable to have the minimum operating voltage be a positive voltage value higher than zero. This is advantageous because it is desirable to have accurate control over the input voltage, and often power supplies exhibit degraded performance when the voltage nears the operating rails. Thus it is often desirable to position the voltage operating range in a positive voltage range where the minimum operating voltage is a voltage value above zero.

In circuits that implement resistive elements, it is desirable to eliminate voltage operating range offsets that result from temperature variations or manufacturing variations in the resistance value of resistive circuit components. A voltage range offset is when the voltage operating range of the circuit is offset along the voltage axis by a voltage offset value. The voltage offset value is the difference between the voltage level that generates a desired current output level, and the voltage level that was supposed to generate the desired current output level. Voltage range offsets result in undesirable variations in an output value as compared to the desired value. Circuits that transfer voltage to current often include one or more resistive elements. The resistance value of a particular resistor can vary by ten or twenty percent due to operating temperature changes, and the resistance value of multiple resistors that are meant to have the same resistance value can also vary by ten or twenty percent due to manufacturing tolerance variations. A variation in a resistance value of a resistor from the desired value can result in voltage operating range offsets and variations in output levels. In situations where the tolerance on output current levels and operating voltage range levels are tight, these offsets, and/or output variations can be unacceptable.

Figure 3:
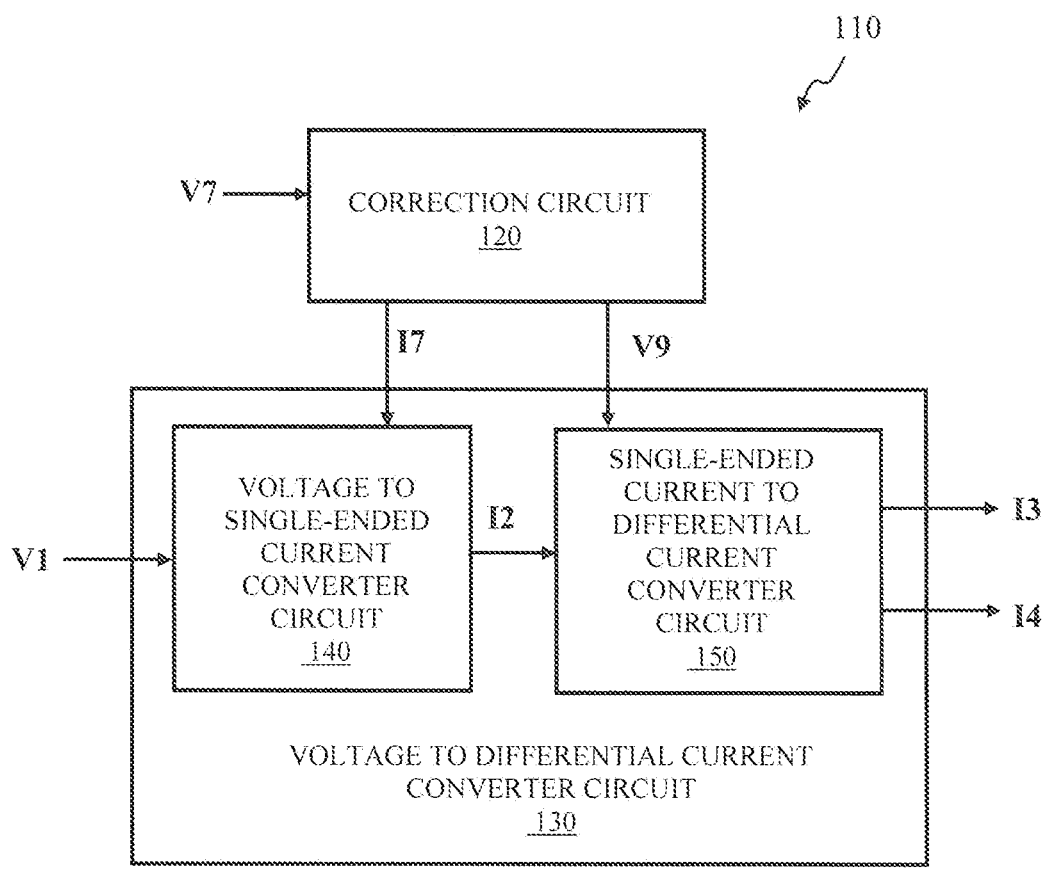
FIG. 3 shows a block diagram of differential current signal circuit 110 according to the invention.
Figure 4:
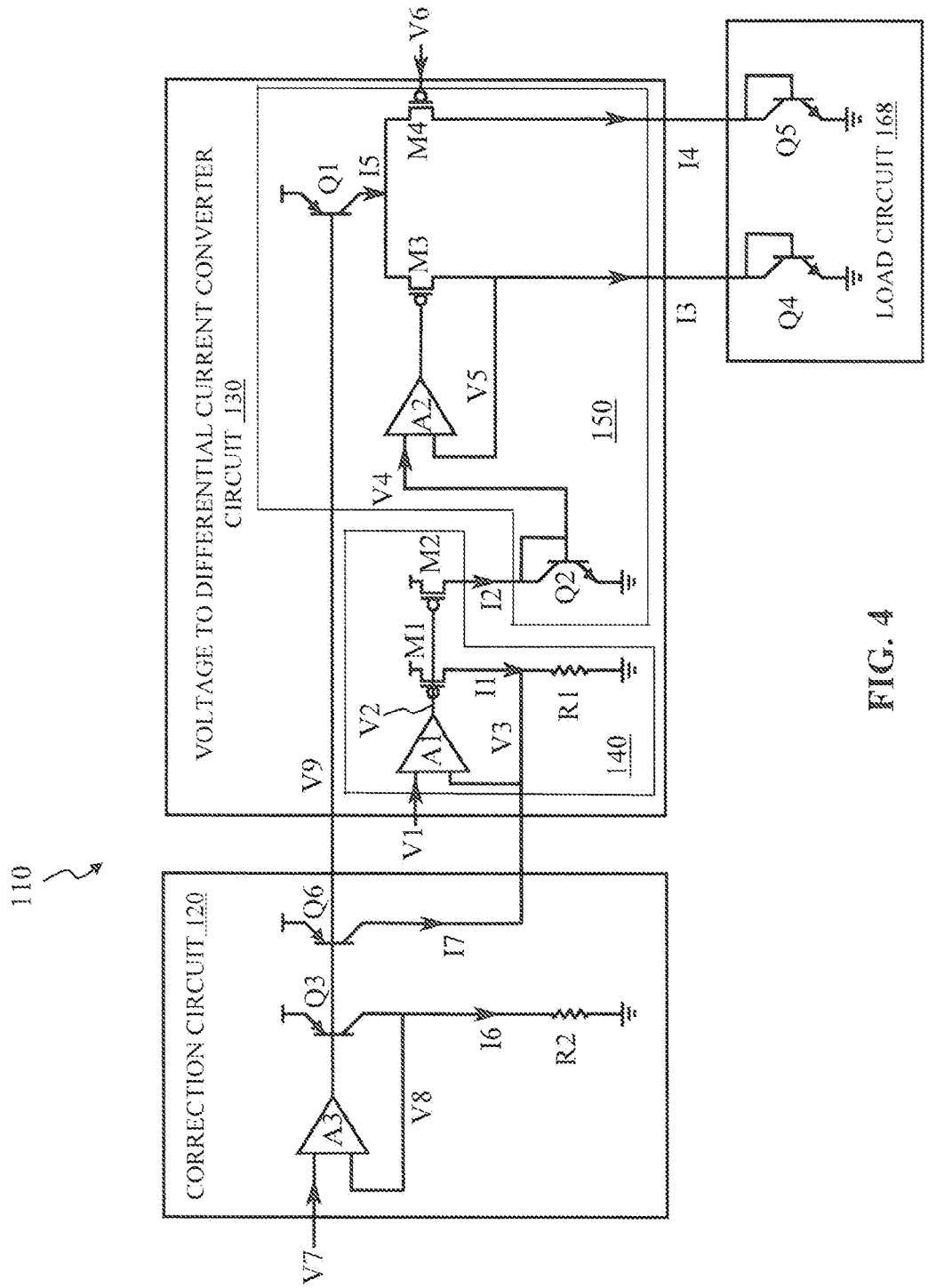
FIG. 4 is a schematic diagram of one embodiment of differential current signal circuit 110 of FIG. 3.
Figure 5:
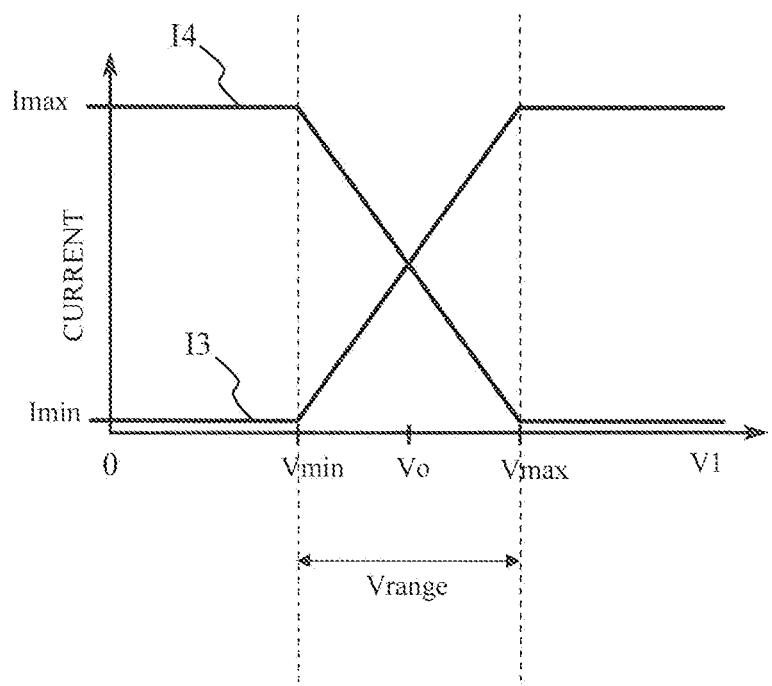
FIG. 5 is the voltage-to-current transfer function of differential current signal circuit 110 of FIG. 3 and FIG. 4.

FIG. 3, FIG. 4, and FIG. 5 show differential current signal circuit 110 according to the invention, which provides differential pair of current output signals I3 and I4 that are linearly proportional to an input voltage signal V1 within a voltage operating range Vrange from a minimum operating voltage Vmin to a maximum operating voltage Vmax, while eliminating the problems discussed above. Differential current signal circuit 110 according to embodiments of the invention provides differential pair of current output signals I3 and I4 with improved linearity and reduced susceptibility to process and temperature variations as compared to other circuits. Differential pair of current output signals I3 and I4 are also referred to as differential pair of current signals I3 and I4 in this document. FIG. 3 shows a block diagram of an embodiment of differential current signal circuit 110 according to the invention. FIG. 4 shows a schematic diagram of one embodiment of differential current signal circuit 110 of FIG. 3, and FIG. 5 shows the voltage-to-current transfer function of differential current signal circuit 110 of FIG. 4. It is to be understood that circuit elements, connections and configurations other than the specific example embodiment shown in FIG. 4 can be used in differential current signal circuit 110 according to the invention.

Differential current signal circuit 110 according to the invention includes voltage to differential current converter circuit 130, and correction circuit 120, as shown in FIG. 3 and FIG. 4. Voltage to differential current converter circuit 130 converts voltage input signal V1 into a differential pair of current output signals I3 and I4, where the differential pair of current output signals includes first end I3 and second end I4. First end I3 is the first end of differential pair of current output signals I3 and I4. Second end I4 is the second end of differential pair of current output signals I3 and I4. In this embodiment differential pair of current output signals I3 and I4 are 180 degrees out of phase, but the invention is not limited in this aspect. In some embodiments differential pair of current output signals I3 and I4 are modified differential signals, and their phase difference is some number of degrees other than 180 degrees. Correction circuit 120 provides the capability to set and adjust the minimum operating voltage of voltage to differential current converter circuit 130, and reduces the susceptibility of voltage to differential current converter circuit 130 to temperature and process variations.

Voltage to differential current converter circuit 130 according to the invention converts voltage input signal V1 into differential pair of current output signals I3 and I4 according to the voltage-to-current transfer function shown in FIG. 5. The X-axis of the graph shown in FIG. 5 represents voltage values of voltage input signal V1. The Y-axis represents the output current levels of differential pair of current output signals I3 and I4. Differential pair of current output signals I3 and I4 are linearly proportional to voltage input signal V1 throughout the voltage operating range Vrange, where Vrange has a voltage range from Vmin to Vmax, as shown in FIG. 5. Vo is the voltage at which the current level of first end I3 is equal to the current level of second end I4. The operating range Vrange is that range of voltage input signals V1 within which differential pair of current output signal pairs I3 and I4 are linearly proportional to voltage input signal V1. Vmin is the voltage input signal V1 which defines the lower end of Vrange. Vmax is the voltage input signal V1 which defines the upper end of Vrange. Vrange is that range of voltage input signals V1 within which differential pair of current output signal pairs I3 and I4 are linearly proportional to voltage input signal V1, where V1=Vmin is the lower voltage boundary of Vrange and V1=Vmax is the upper voltage boundary of Vrange. First end I3 is at minimum current level Imin in response to values of voltage input signal V1 that are lower than Vmin, as shown in FIG. 5. As voltage input signal V1 reaches Vmin and increases from Vmin to Vmax throughout the voltage operating range Vrange, the current level of first end I3 increases from Imin to Imax, where I3 is linearly proportional to V1 throughout this range. At levels of V1 larger than Vmax, I3 remains at maximum current level Imax.

The current level of second end I4 is at maximum current level Imax in response to values of voltage input signal V1 that are lower than Vmin, as shown in FIG. 5. As voltage input signal V1 reaches Vmin and increases from Vmin to Vmax throughout the voltage operating range Vrange, the current level of second end I4 decreases from Imax to Imin, where I4 is linearly proportional to V1 throughout this range. At levels of V1 larger than Vmax, I4 remains at minimum current level Imin. In this way differential pair of current output signals I3 and I4 are both linearly proportional to V1 throughput the voltage operating range Vrange from minimum operating voltage Vmin to maximum operating voltage Vmax. Differential pair of current output signals I3 and I4 are linear through the entire voltage operating range Vrange from Vmin to Vmax, similar to the desired response indicated by line 106 and line 107 in FIG. 2. Therefore voltage to differential current converter circuit 130 has a wide voltage operating range Vrange within which differential pair of current output signals I3 and I4 are linearly proportional to voltage input signal V1.

FIG. 5 also illustrates that the embodiment of differential current signal circuit 110 according to the invention as shown in FIG. 3 and FIG. 4 has a voltage operating range Vrange that consists of all positive voltage values. Vmin is a positive voltage value that can be adjusted to be within the linear range of the power supply. In this embodiment voltage input signal V1 rises above zero to a value equal to Vmin before differential pair of current output signals I3 and I4 are linearly proportional to V1. In this way differential current signal circuit 110 has a positive minimum operating voltage Vmin. This allows differential current signal circuit 110 to avoid issues due to degraded power supply voltage levels when the voltage level approaches zero.

Differential current signal circuit 110 according to the invention also includes correction circuit 120, as shown in FIG. 3 and FIG. 4. Correction circuit 120 provides a bias voltage to voltage to differential current converter circuit 130 in the form of tracking bias signal V9. Correction circuit 120 provides tracking bias voltage V9 and set minimum operating voltage signal I7 to voltage to differential current converter circuit 130 in response to correction circuit 120 receiving correction input voltage V7. Set minimum operating voltage signal I7 allows adjusting of the minimum operating voltage Vmin of voltage to differential current converter circuit 130.

Tracking bias voltage V9 eliminates voltage offsets in the voltage operating range due to process and temperature variations. A voltage offset is the difference between the voltage value that generates a particular output current value, and the voltage value that by design was supposed to generate the particular current output value. Voltage offsets in a circuit result in the voltage operating range being moved along the X-axis of the voltage-to-current transfer function graph by the voltage offset value. Voltage to differential current converter circuit 130 includes current source transistor Q1 as shown in FIG. 4. Current source transistor Q1 provides current source signal I5 to source-coupled transistor M3 and M4, which divide current source signal I5 into differential pair of current output signals I3 and I4. Variations in the current level of I5 due to manufacturing tolerances, or temperature variations for example, can cause the current output level of I3 and I4 to be offset from their desired value along the voltage scale, causing a voltage operating range offset. In this embodiment of differential current circuit 110 as shown in FIG. 3 and FIG. 4, undesirable voltage operating range offset is eliminated in response to current source transistor Q1 of voltage to differential current converter circuit 130 receiving tracking bias signal V9 from correction circuit 120, as will be explained in more detail shortly.

Set minimum operating voltage signal I7 provided by correction circuit 120 to voltage to differential current converter circuit 130 is used to set the minimum operating voltage Vmin of voltage to differential current converter circuit 130, as will be explained in more detail shortly. The minimum operating voltage Vmin of voltage to differential current converter circuit 130 is adjusted in response to adjusting set minimum operating voltage signal I7. In addition, set minimum operating voltage signal I7 as received by voltage to differential current converter circuit 130 eliminates voltage offset in the minimum operating voltage due to process and temperature variations. Correction circuit 120 provides tracking bias voltage V9 and set minimum operating voltage signal I7 to voltage to differential current converter circuit 130, which allows adjusting of the minimum operating voltage Vmin of voltage to differential current converter circuit 130 and also eliminates voltage operating range offsets due to process and temperature variations of voltage to differential current converter circuit 130.

Voltage to differential current converter circuit 130 according to the invention includes voltage to single-ended current converter circuit 140, and single-ended current to differential current converter circuit 150, as shown in FIG. 3 and FIG. 4. Voltage to single-ended current converter circuit 140 converts voltage input signal V1 into single-ended current signal I2, where I2 is linearly proportional to V1 within a voltage operating range from a minimum voltage level to a maximum voltage level. Single-ended current to differential current converter circuit 150 converts single-ended current signal I2 into differential pair of current output signals I3 and I4, where differential pair of current output signals I3 and I4 are linearly proportional to voltage input signal V1 within a voltage operating range Vrange from minimum operating voltage Vmin to maximum operating voltage Vmax.

Figure 6:
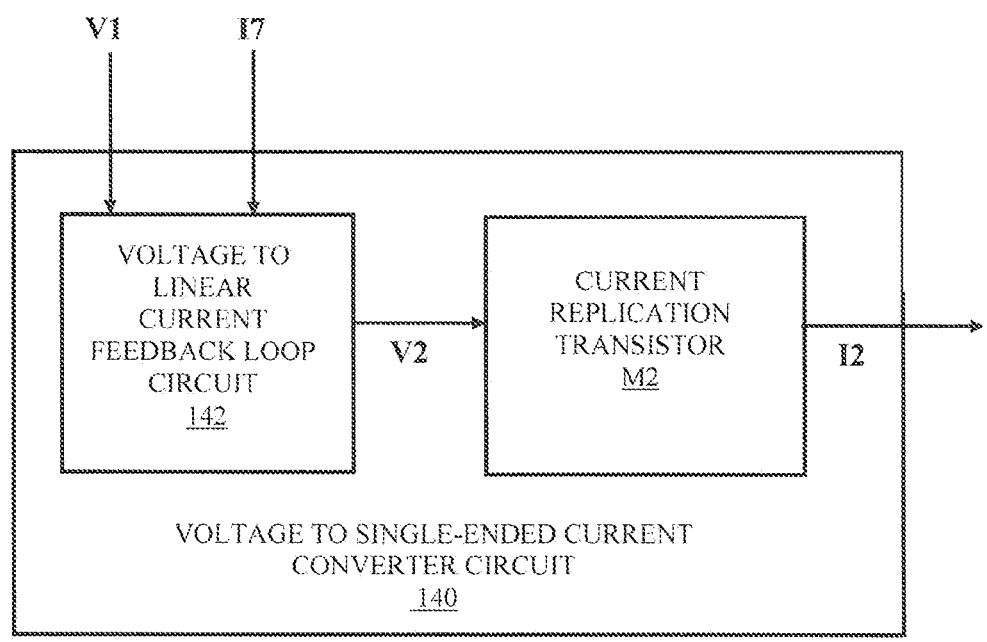
FIG. 6 is a block diagram of voltage to single-ended current converter circuit 140 according to the invention of differential current signal circuit 110 of FIG. 3.
Figure 7:
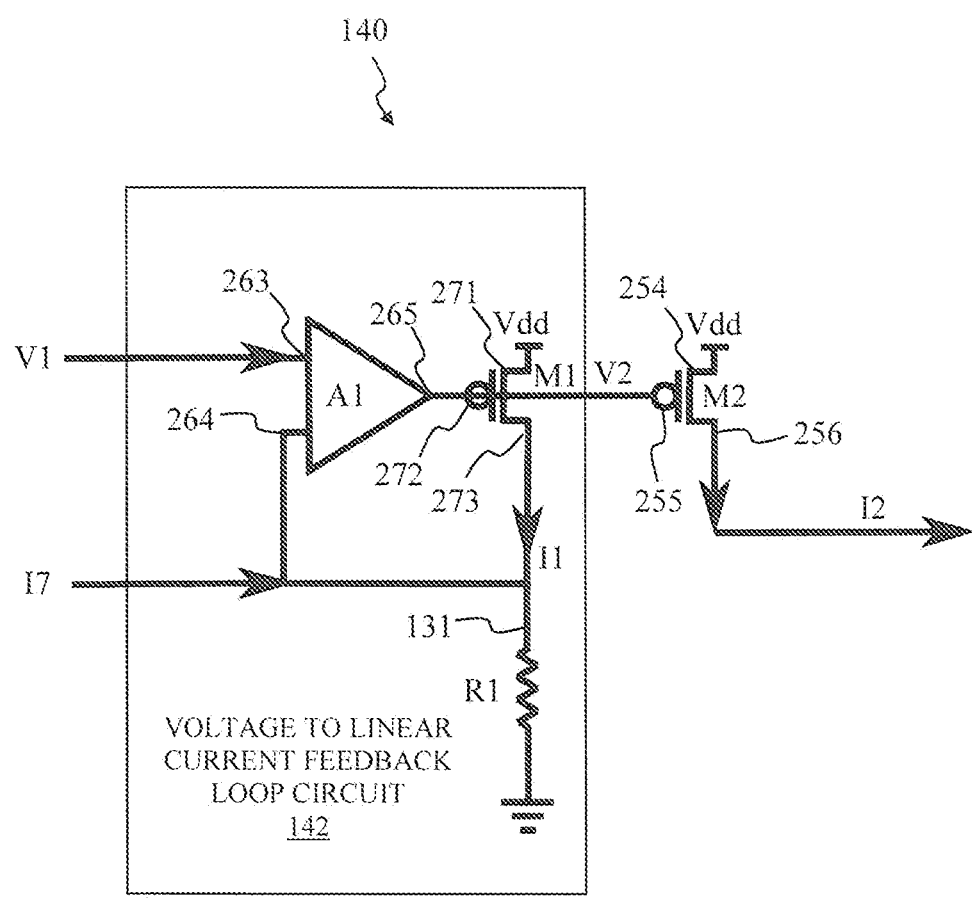
FIG. 7 is a schematic diagram of one embodiment of voltage to single-ended current converter circuit 140 of FIG. 6.

Voltage to single-ended current converter circuit 140 includes voltage to linear current feedback loop circuit 142, and current replication transistor M2, as shown in block diagram form in FIG. 6 and in one possible schematic embodiment in FIG. 7. Voltage to linear current feedback loop circuit 142 generates current replication voltage V2 in response to receiving voltage input signal V1. Current replication transistor M2 generates single-ended current signal I2 in response to receiving current replication voltage V2, where single-ended current signal I2 is linearly proportional to voltage input signal V1 within a voltage operating range from a minimum voltage level to a maximum voltage level. It is to be understood that circuit elements, connections, and configurations other than the specific schematic embodiment shown in FIG. 7 can be used in voltage to single-ended current converter circuit 140 according to the invention.

In the embodiment of FIG. 7, voltage to linear current feedback loop circuit 142 includes first feedback amplifier A1, first feedback transistor M1, and converter resistor R1. First feedback amplifier A1, first feedback transistor M1, and converter resistor R1 form a first feedback loop. First feedback amplifier A1, first feedback transistor M1, and converter resistor R1 convert voltage input signal V1 into single-ended interim current signal I1 and current replication voltage V2. First feedback amplifier A1 first input node 263 receives voltage input signal V1. First feedback amplifier second input node 264 is coupled to first end I31 of converter resistor R1, and first feedback transistor M1 drain node 273. First feedback transistor M1 source node is coupled to supply voltage Vdd. First feedback transistor M1 gate node 272 is coupled to first feedback amplifier A1 output node 265. First feedback amplifier output node 265 outputs current replication voltage V2 in response to first feedback amplifier A1 first input node 263 receiving voltage input signal V1. In one embodiment supply voltage Vdd is two volts, but the invention is not limited in this aspect. In one embodiment the resistance value of R1 is 20K ohms, but the invention is not limited in this aspect.

Voltage to linear current feedback loop circuit 142, which includes first feedback amplifier A1, first feedback transistor M1, and converter resistor R1, converts voltage input signal V1 into single-ended interim current signal I1 according to a voltage-to-current transfer function give by $$I1 = \frac{V1*gm1*Av1}{1+(R1*gm1*Av1)}, \quad (1)$$

where V1 is the voltage value of voltage input signal V1, R1 is the resistance value of converter resistor R1, gm1 is the transconductance of first feedback transistor M1 and Av1 is the voltage gain of first feedback amplifier A1. In this embodiment R1*gm1*Av1 is much greater than 1, so the voltage-to-current transfer function of voltage to linear current feedback loop circuit 142 can be reduced to $$I1 \approx \frac{V1}{R1}. \quad (2)$$

Since equation 2 is highly linear, single-ended interim current signal I1 is linearly proportional to voltage input signal V1. In this way voltage to linear current feedback loop circuit 142 includes a first feedback loop which generates single-ended interim current signal I1 that is linearly proportional to voltage input signal V1. In this way voltage to linear current feedback loop circuit generates single-ended interim current signal I1 in response to receiving voltage input signal V1, where single-ended interim current signal I1 is linearly proportional to voltage input signal V1. And in this way voltage to linear current feedback loop circuit generates current replication voltage V2 in response to receiving voltage input signal V1. It is to be understood that the specific circuit design and elements shown in FIG. 4 and FIG. 7 are examples of one specific embodiment of voltage to linear current feedback loop circuit 142. Other circuit elements, discrete, or integrated, can be used in other embodiments of voltage to linear current feedback loop circuit 142 according to the invention. In some embodiments other circuit elements and other forms of feedback loop circuits are used for voltage to linear current feedback loop circuit 142.

The conversion of voltage input signal V1 into interim current signal I1 according to equation 2 forms the basis for the later generation of differential pair of current output signals I3 and I4. Since interim current I1 is determined by the resistance value of R1, which can vary due to processing variations and temperature variations, it would be possible for interim current signal I1, and its derivatives I3 and I4, to vary due to process and temperature variations in the resistance value of R1. However, these variations are eliminated in differential current signal circuit 110 through the use of correction circuit 120, as will be discussed shortly.

First feedback amplifier A1 outputs current replication voltage V2 to both first feedback transistor M1 and current replication transistor M2, as shown in FIG. 4 and FIG. 7. Current replication transistor M2 is chosen in this embodiment to be the same type of transistor as first feedback transistor M1, such that current replication transistor M2 outputs single-ended current signal I2 in response to receiving current replication voltage V2, where single-ended current signal I2 is a duplicate of interim current signal I1 within a current operating range from a minimum operating current to a maximum operating current. Current replication transistor M2 source node 254 receives the supply voltage. Current replication transistor M2 drain node 256 outputs single-ended current signal I2 in response to current replication transistor gate node 255 receiving current replication voltage V2. In this way current replication transistor M2 duplicates single-ended interim current signal I1 as single-ended current signal I2, where single-ended current signal I2 is equal to interim current signal I1 within a current operating range from a minimum operating current to a maximum operating current. Since interim current signal I1 is linearly proportional to input voltage signal V1, single-ended current signal I2 is also linearly proportional to input voltage signal V1 within the voltage operating range Vrange from minimum operating voltage Vmin to maximum operating voltage Vmax. In this way current replication transistor M2 generates single-ended current signal I2 in response to receiving current replication voltage V2, where single ended current signal I2 is linearly proportional to voltage input signal V1 within voltage operating range Vrange from minimum operating voltage Vmin to maximum operating voltage Vmax.

In this embodiment current replication transistor M2 is the same type of transistor as first feedback transistor M1, which results in single-ended current signal I2 being equal to interim current signal I1. In some embodiments of differential current signal circuit 110 according to the invention, transistors M1 and M2 are not the same type of transistor, but their voltage-to-current transfer functions are linearly proportional to each other. In some embodiments the voltage-to-current transfer function of current replication transistor M2 is linearly proportional to the voltage-to-current transfer function of first feedback transistor M1, such that I2 is linearly proportional to I1. In some embodiments current replication transistor M2 is a different type of transistor than first feedback transistor M1. In some embodiments other types of circuits or transistors or electrical elements are used for first feedback transistor M1 and/or current replication transistor M2. In voltage to single-ended current converter circuit 140 according to the invention, the voltage-to-current transfer functions of M1 and M2 are linearly proportional to each other, and therefore single-ended current signal I2 is linearly proportional to interim current signal I1.

Figure 8:
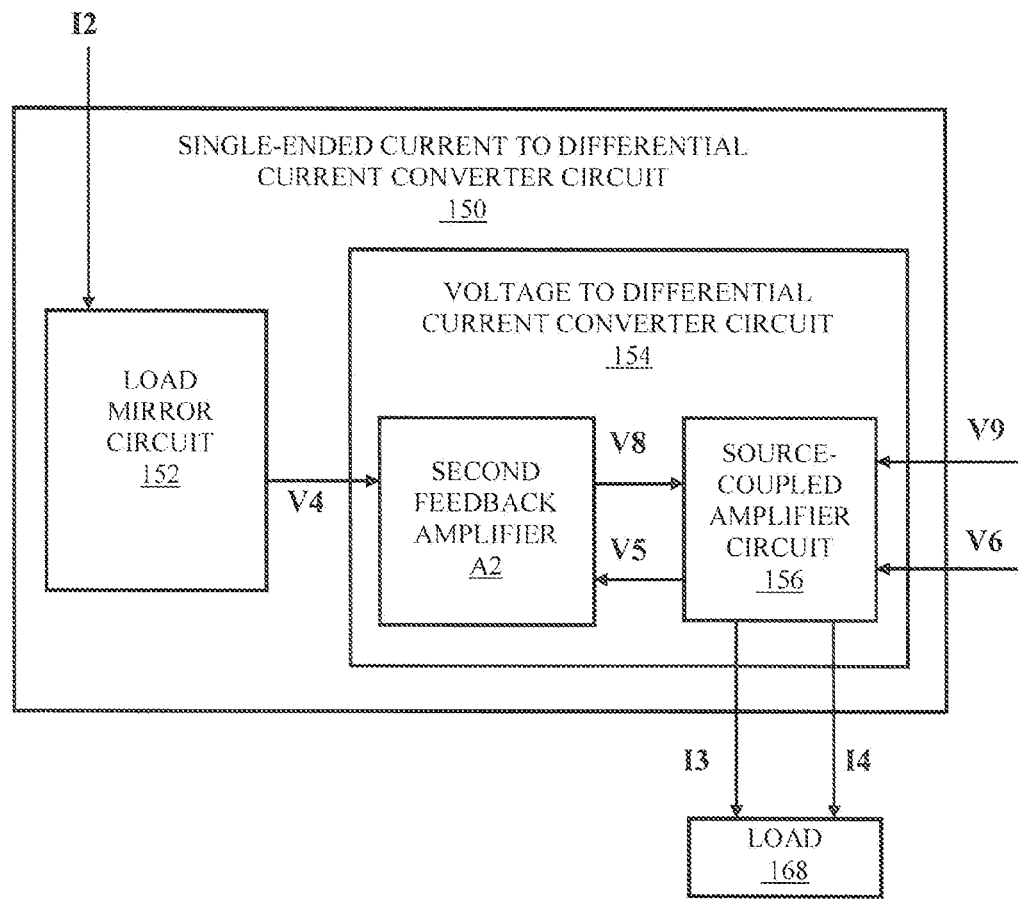
FIG. 8 is a block diagram of single-ended current to differential current converter circuit 150 according to the invention of differential current signal circuit 110 of FIG. 3, and load circuit 168.

Single-ended current to differential current converter circuit 150 converts single-ended current signal I2 into differential pair of current output signals I3 and I4, where I3 and I4 are linearly proportional to voltage input signal V1 within a voltage operating range Vrange from Vmin to Vmax. Single-ended current to differential current converter circuit 150 converts single-ended current signal I2 into differential pair of current output signals I3 and I4, where I3 and I4 are linearly proportional to single-ended current signal I2 within a current operating range from a minimum current level to a maximum current level. Single-ended current to differential current converter circuit 150 includes load mirror circuit 152, and voltage to differential current converter circuit 154 as shown in block diagram form in FIG. 8, and in one schematic embodiment in FIG. 4 and FIG. 9.

Load mirror circuit 152 converts single-ended current signal I2 into load-mirrored voltage signal V4. In the embodiment of load-mirror circuit 152 shown in FIG. 9, load mirror circuit 152 includes load mirror transistor Q2. Load mirror transistor collector node 159 receives single-ended current signal I2, and load mirror transistor base node 160 outputs load-mirrored voltage signal V4 in response. Load mirror transistor Q2 base node 160 and load mirror transistor collector node 159 are coupled together. Load mirror transistor Q2 emitter node 161 is coupled to a current return path. Load mirror circuit 152 has a nonlinear current-to-voltage transfer function that in this embodiment is determined by the logarithmic impedance function of load mirror transistor Q2, given by $$V4 = Vt * \ln\left(\frac{I2}{Is}\right), \quad (3)$$

where Vt is the transistor thermal voltage and Is is the transistor scaling current. Load mirror circuit 152 outputs load-mirrored voltage signal V4 in response to receiving single-ended current signal I2, where load-mirrored voltage signal V4 is a nonlinear function of single-ended current signal I2.

Figure 9:
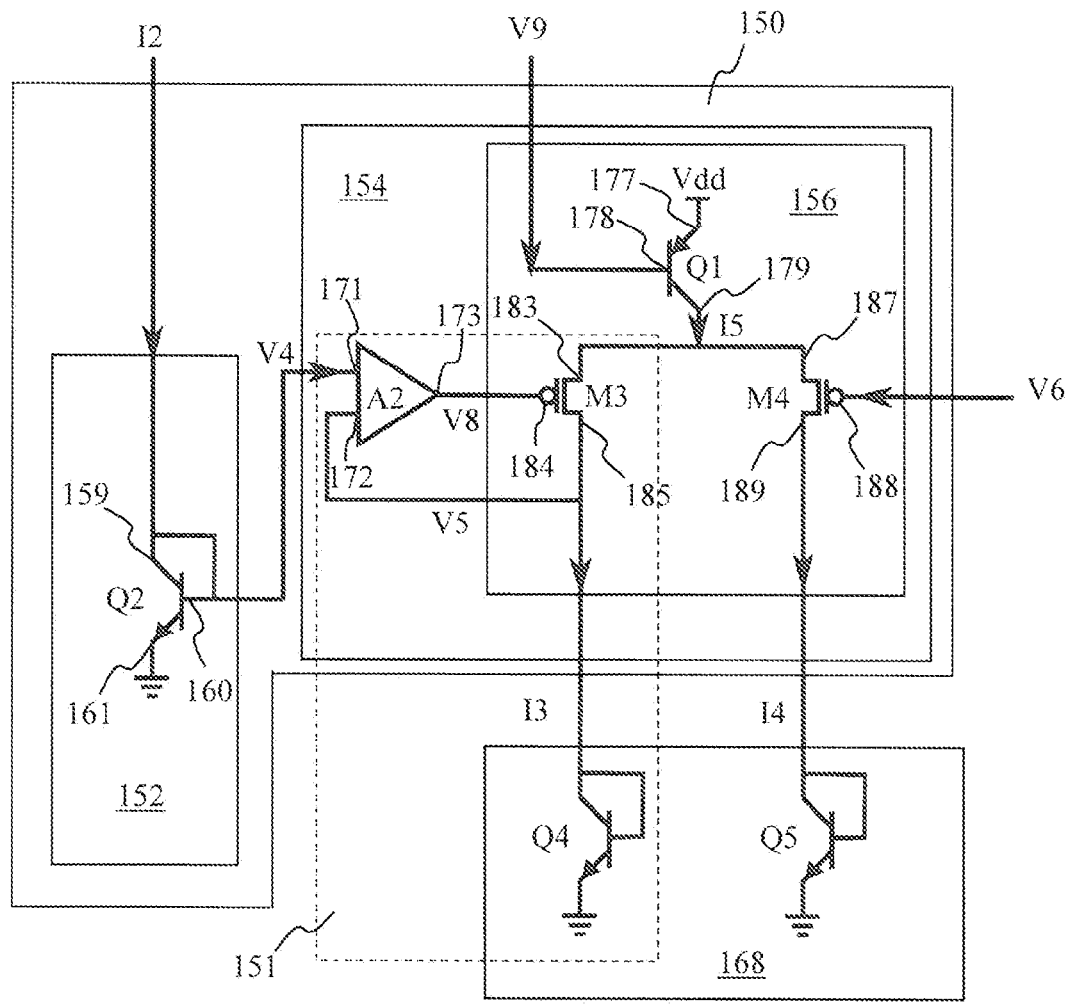
FIG. 9 is a schematic diagram of one embodiment of single-ended current to differential current converter circuit 150 and load circuit 168 of FIG. 8.

In load mirror circuit 152 according to the invention, load mirror circuit 152 has an impedance that is linearly proportional to the impedance of load 168 that is seen by differential pair of current output signals I3 and I4. In the embodiment of load mirror circuit 152 of FIG. 4 and FIG. 9, load mirror transistor Q2 is the same type of transistor as load transistors Q4 and Q5 that are seen by differential pair of current output signals I3 and I4. In this embodiment differential pair of current output signal first end I3 sees load transistor Q4 as shown in FIG. 9. Differential pair of current output signals second end I4 sees load transistor Q5 in the embodiment shown in FIG. 9. In this embodiment load mirror transistor Q2 is the same type of transistor as load transistor Q4 and load transistor Q5. Therefore in this embodiment the impedance of load mirror transistor Q2 is the same as the impedance of load transistors Q4 and Q5, and the current-to-voltage transfer function of load mirror transistor Q2 is the same as the current-to-voltage transfer function of Q4 and Q5. In some embodiments load mirror circuit 152 is a transistor of a different type than load transistors Q4 and Q5, where load mirror transistor Q2 has an impedance that is linearly proportional to load transistors Q4 and Q5. In some embodiments load mirror circuit 152 is a circuit which has an impedance that is linearly proportional to load transistors Q4 and Q5. In some embodiments load mirror circuit 152 has a current-to-voltage transfer function that is linearly proportional to the current-to-voltage transfer function of Q4 and Q5.

Voltage to differential current converter circuit 154 converts load-mirrored voltage signal V4 into differential pair of current output signals I3 and I4, where differential pair of current output signals I3 and I4 are linearly proportional to single-ended current signal I2 within a current operating range from a minimum operating current to a maximum operating current. Voltage to differential current converter circuit 154 converts load-mirrored voltage signal V4 into differential pair of current output signals I3 and I4, where differential pair of current output signals I3 and I4 are linearly proportional to voltage input signal V1 within a voltage operating range Vrange from minimum operating voltage Vmin to maximum operating voltage Vmax, as shown in FIG. 4, FIG. 5, FIG. 8, and FIG. 9. Voltage to differential current converter circuit 154 according to the invention includes second feedback amplifier A2 and source-coupled amplifier circuit 156. Second feedback amplifier A2 generates second feedback amplifier output voltage V8 in response to receiving load-mirrored voltage signal V4. Source-coupled amplifier circuit 156 generates differential pair of current output signals I3 and I4 in response to receiving second feedback amplifier output voltage V8, tracking bias signal V9, and bias voltage V6, as shown in the figures. Differential pair of current output signals I3 and I4 are provided to load circuit 168. In this embodiment load circuit 168 includes load transistors Q4 and Q5. In this embodiment differential pair of current output signals first end I3 sees load transistor Q4, and differential pair of current output signals second end I4 sees load transistor Q5. In this embodiment load transistor Q4 and load transistor Q5 are both the same type of transistor as load mirror transistor Q2, and so the impedance of load mirror circuit 152 is equal to the impedance of load transistor Q4 and the impedance of load transistor Q5. In some embodiments the impedance of load transistor Q4, load transistor Q5, and load mirror circuit 152 are linearly proportional to one another. In some embodiments the impedance of load mirror circuit 152 is linearly proportional to load circuit 168 as seen by differential pair of current output signals I3 and I4.

Differential pair of current output signals I3 and I4 are generated by source-coupled amplifier circuit 156. In this embodiment source-coupled amplifier circuit 156 includes current source transistor Q1, first source-coupled transistor M3, and second source-coupled transistor M4, as shown in FIG. 9. Source-coupled amplifier circuit 156 generates differential pair of current output signals I3 and I4 in response to receiving bias voltages at the base nodes of current source transistor Q1, first source-coupled transistor M3, and second source-coupled transistor M4. Source-coupled amplifier circuit 156 converts the difference in voltages as seen by the gate nodes 184 and 188 of M3 and M4 respectively into differential pair of current output signals I3 and I4. Current source transistor Q1 supplies the current for I3 and I4 such that $$I5 = I3 + I4. \quad (4)$$

In a traditional source-coupled amplifier circuit (see FIG. 1), Q1 base node 178 would receive a bias voltage, and transistors M3 and M4 would convert the difference between the bias voltages of transistors M3 and M4 into a differential pair of current output signals according to a nonlinear voltage-to-current function given by lines 104 and 105 of FIG. 2, where the X-axis would be the voltage difference at the base node of M3 and M4, line 104 would represent the first end of the differential pair of current output signals, and line 105 would represent the second end of the differential pair of current output signals. However, as discussed earlier, this nonlinear voltage-to-current transfer function is not what is desired from differential current signal circuit 110 according to the invention. Therefore, voltage to differential current converter circuit 154 according to the invention adds novel features described herein to source-coupled amplifier circuit 156 to improve the linearity of the output signals and widen the voltage operating range.

One feature of voltage to differential current converter circuit 156 is that current source transistor Q1 base node 178 receives tracking bias signal V9 as its bias voltage. Receiving tracking bias signal V9 at current source transistor base node 178 provides voltage to differential current converter circuit 130 the capability to eliminate offsets in the voltage operating range due to variations in the resistance value of R1 and R2. This capability will be discussed in more detail shortly.

Another feature of voltage to differential current converter circuit 156 is that a second feedback loop circuit is implemented to ensure linearity of I3 and I4 within a wide voltage operating range. Second feedback loop 151 includes second feedback loop amplifier A2, first source-coupled transistor M3, and first load transistor Q4, as shown in the dotted line box in FIG. 9. The voltage-to-current transfer function of feedback loop 151 according to the invention is nonlinear, and is inversely proportional to the current-to-voltage transfer function of load mirror circuit 152 when the impedance of load mirror circuit 152 is linearly proportional to the impedance of load transistor Q4.

In the embodiment shown in FIG. 9, second feedback loop amplifier A2 first input node 171 receives load-mirrored voltage signal V4, where load-mirrored voltage signal is generated by load mirror circuit 152. First source-coupled transistor M3 gate node 184 receives second feedback amplifier output voltage V8 from second feedback amplifier output node 173. First source-coupled transistor M3 drain node 185 is coupled to second feedback loop amplifier A2 second input node 172 and first load transistor Q4 collector and base nodes. When first load transistor Q4 has the same impedance function as load mirror transistor Q2, second feedback loop 151 requires voltage V5 at second feedback transistor input node 172 to be equal to load-mirrored voltage V4, which forces the current level of first end of differential pair of current output signals I3 to be equal to the current level of single-ended current signal I2 within the current operating range of single-ended current signal I2. Since I3=I2 in this embodiment, and given that V4 is defined by the current-to-voltage transfer function of equation 3, the voltage-to-current transfer function of feedback loop circuit 131 is equal to the inverse of the current-to-voltage transfer function of load mirror circuit 152. Feedback loop circuit 151 defines the voltage-to-current transfer function of voltage to differential current converter circuit 154 for the generation of differential pair of current output signals first end I3. Thus when first load transistor Q4 has the same impedance function as load mirror transistor Q2, the voltage-to-current transfer function of voltage to differential current converter circuit 154 defining the generation of differential pair of current output signals first end I3 is inversely proportional to the current-to-voltage transfer function of load mirror circuit 152. In this way load mirror circuit 152 converts single-ended current signal I2 into load-mirrored voltage signal V4 according to a current-to-voltage transfer function given by equation 3, and voltage to differential current converter circuit 154 converts load-mirrored voltage signal V4 into differential pair of current output signals first end I3 according to a voltage-to current-transfer function that is inversely proportional to the current-to-voltage transfer function of load mirror circuit 152. In embodiments where first load transistor Q4 has the same impedance function as load mirror transistor Q2, differential pair of current output signals first end I3 is equal to single-ended current signal I2.

In some embodiments load mirror circuit 152 given by load mirror transistor Q2 has an impedance that is not equal to, but linearly proportional to, the impedance of load transistor Q4. In embodiments where first load transistor Q4 has an impedance function that is linearly proportional to the impedance of load mirror transistor Q2, differential pair of current output signals first end I3 is linearly proportional to single-ended current signal I2. In these embodiments second feedback loop 151 forces first end of differential pair of current output signals I3 to be linearly proportional to single-ended current signal I2 within the current operating range of single-ended current signal I2.

In this way second feedback loop 151 generates first end of differential pair of current output signals I3, where first end of differential pair of current output signals I3 is equal to single-ended current signal I2, when the impedance of load mirror circuit 152 is equal to the impedance of load 168 as seen by first end of differential pair of current output signals I3. Second feedback loop 151 generates first end of differential pair of current output signals I3, where first end of differential pair of current output signals I3 is equal to single-ended current signal I2, when the impedance of load mirror transistor Q2 is equal to the impedance of load transistor Q4 as seen by first end of differential pair of current output signals I3. Second feedback loop 151 generates first end of differential pair of current output signals I3, where first end of differential pair of current output signals I3 is linearly proportional to single-ended current signal I2, when the impedance of load mirror circuit 152 is linearly proportional to the impedance of load 168 as seen by first end of differential pair of current output signals I3.

First end of differential pair of current output signal I3 is linearly proportional to single-ended current signal I2 in response to the impedance of load mirror circuit 152 being linearly proportional to the impedance of load 168 as seen by first end of differential pair of current output signals I3. The level of linear proportionality between the nonlinear impedance functions of load mirror circuit 152 and load 168 as seen by I3 will determine the level of linearity between first end of differential pair of current output signals I3 and single-ended current signal I2 (and therefore between first end of differential pair of current output signals I3 and interim current signal I1 and between first end of differential pair of current output signals I3 and voltage input signal V1). In this way voltage to differential current converter circuit 154 generates first end of differential pair of current output signals I3 from load-mirrored voltage signal V4 using second feedback loop circuit 151. Voltage to differential current converter circuit 154 generates first end of differential pair of current output signals I3 from load-mirrored voltage signal V4, where first end of differential pair of current output signal I3 is linearly proportional to voltage input signal V1 within voltage operating range Vrange from minimum operating voltage Vmin to maximum operating voltage Vmax in response to the impedance of load mirror transistor Q2 being linearly proportional to the impedance of load 168 that is receiving first end of differential pair of current output signal I3

Second source-coupled amplifier M4 generates differential pair of current output signals second end I4 according to equation 4 at second source-coupled amplifier M4 gate node 189. Differential pair of current output signal second end I4 is 180 degrees out of phase from differential pair of current output signals first end I3. Differential pair of current output signals I3 and I4 are generated according to the voltage-to-current transfer function as shown in FIG. 5, where V1 is voltage input signal V1. Differential pair of current output signals I3 and I4 are linearly proportional to V1 within a range of operating voltages Vrange from Vmin to Vmax. In this embodiment of differential current signal circuit 110, Vo is that voltage at which I3=I4, which occurs when V1=Vo=V6. In this embodiment V7 is equal to V6. In some embodiments V6 and V7 are not the same voltage value. In a particular embodiment, source voltage Vdd is 2 volts, correction input voltage V7 is the same as bias voltage V6 which is 1 volt, and Vo is equal to 1 volt. In this same example embodiment, the resistance value of R1 is 20K ohms, and the resistance value of R2 is 10K ohms. This specific embodiment of differential current signal circuit 110 according to the invention leads to Vmin being equal to 500 millivolts, and Vmax being equal to 1.5 volts, which means that the voltage operating range Vrange (see FIG. 5) is equal to 1 volt. In this same specific embodiment Imin is zero amps, and Imax is equal to 100 microamps. It is to be understood that this is one specific example embodiment and that the circuit is not limited to these example values.

In this way single-ended current to differential current converter circuit 150 outputs differential pair of current output signal I3 and I4 in response to receiving single-ended current signal I2, where differential pair of current output signals I3 and I4 are linearly proportional to single-ended current signal I2 within a range of operating current values from Imin to Imax. Single-ended current signal I2 is linearly proportional to interim current signal I1 within the range of current values from Imin to Imax. Interim current signal I1 is linearly proportional to voltage input signal V1 within the voltage operating range from Vmax to Vmin. Differential pair of current output signals I3 and I4 are linearly proportional to input voltage signal V1 within an operating range Vrange from a minimum operating voltage Vmin to a maximum operating voltage Vmax as shown in FIG. 5. In this way voltage to differential current converter circuit 130 outputs differential pair of current output signal I3 and I4 in response to receiving voltage input signal V1, where differential pair of current output signals I3 and I4 are linearly proportional to voltage input signal V1 within voltage operating range Vrange from minimum operating voltage Vmin to maximum operating voltage Vmax.

Figure 10:
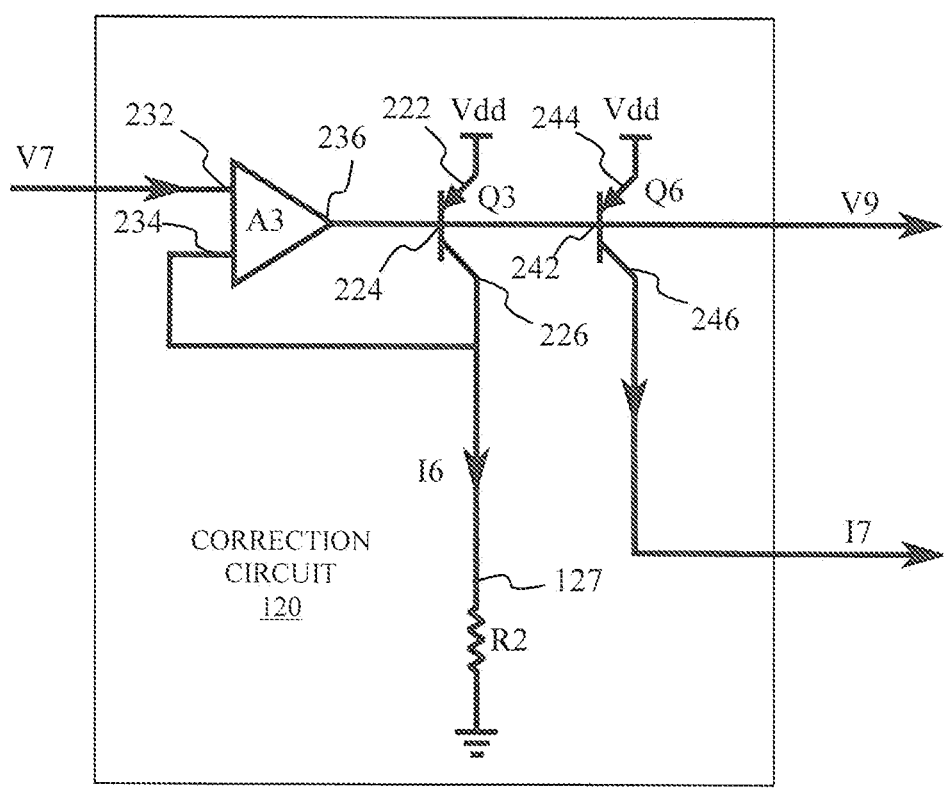
FIG. 10 is a schematic diagram of one embodiment of correction circuit 120 of FIG. 3.

Differential current signal circuit 110 according to the invention also includes correction circuit 120, as shown in FIG. 3, FIG. 4, and FIG. 10. Correction circuit 120 provides differential current signal circuit 110 the capability to set and adjust the minimum operating voltage of voltage to differential current converter circuit 130, and reduces the susceptibility of voltage to differential current converter circuit 130 to temperature and process variations. Correction circuit 120 is shown in one possible schematic embodiment in FIG. 4 and FIG. 10. In some embodiments correction circuit 120 is implemented with other circuit elements. Correction circuit 120 generates tracking bias voltage V9 and set minimum operating voltage signal I7 in response to receiving correction input voltage V7.

In this embodiment of differential current signal circuit 110, second source-coupled transistor M4 receives bias voltage V6 at gate node 188. The bias voltage provided to current source transistor Q1 base node 178 is tracking bias signal V9, where tracking bias signal V9 is generated by correction circuit 120 in response to receiving correction input voltage V7.

Correction circuit 120 includes a third feedback loop, where the third feedback loop includes tracking bias amplifier A3, tracking bias transistor Q3, and tracking bias resistor R2. Tracking bias amplifier first input node 232 receives correction input voltage V7. Tracking bias amplifier second input node 234 is coupled to tracking bias transistor Q3 collector node 226 and first end 127 of tracking bias resistor R2. Tracking bias amplifier output node 236 outputs tracking bias signal V9. Therefore the amplitude of tracking bias signal V9 is a function of the resistance value of R2. Tracking bias amplifier output node 236 is coupled to tracking bias transistor base node 224. Tracking bias transistor Q3 emitter node 222 receives the supply voltage. Tracking bias amplifier A3, tracking bias transistor Q3, and tracking bias resistor R2 create tracking bias current I6, given by $$I6 \approx \frac{V7}{R2}, \quad (5)$$

where V7 is equal to the voltage value of correction input voltage V7, and R2 is the resistance value of tracking bias resistor R2. Equation 5 for I6 is derived similarly to interim current signal I1 earlier. Therefore the amplitude of tracking bias current I6, and the amplitude of tracking bias signal V9 output from tracking bias amplifier A3 are both a function of the resistance value of R2.

Tracking bias signal V9 is received by current source transistor Q1 base node 178. In this embodiment Q1 and Q3 are chosen to be the same type of transistor, therefore I5 is equal to I6. Current signals I1, I2, and I3 and are all derived from the resistance value of R1, as discussed earlier. In differential current signal circuit 110 according to the invention, resistors R1 and R2 are made by the same process, and so their resistance values will vary proportionally to each other due to process variations and temperature variations. In the embodiment shown, resistor R2 is chosen to have a resistance value that is half the resistance value of R1, but the invention is not limited in this aspect.

Correction circuit 120 according to the invention eliminates voltage range offsets and output signal variation due to process and temperature-related resistance value variations because resistor R1 and R2 are made by the same process and their resistance values will vary proportionally to one another. For example, current source signal I5 is derived from the resistance value of tracking bias resistor R2. Variations in the resistance value of R2 due to process or temperature variations could cause the voltage operating range Vrange to be offset from its desired value by some voltage offset amount. This can result in a desired current value for differential pair of current output signals I3 and I4 requiring a voltage input value that is offset from the expected input value. It may be important, for example, to know the voltage value of Vo, where the current level of I3 and I4 are equal to one another. When the voltage operating range has an offset voltage given by Voffset introduced into it, a voltage input signal value of V1=Vo will result in current levels for I3 and I4 that are not equal to one another. Instead, the voltage value that results in equal current levels for I3 and I4 will be V1=Vo+Voffset. It is apparent that for precision circuits the voltage range offset can have undesirable results. However, in differential current signal circuit 110 according to the invention, the current value of I1, I2, and I3 is derived from the resistance value of R1. Since the resistance values of R1 and R2 will vary proportionally in differential current signal circuit 110 according to the invention, the voltage offsets resulting from variations in the resistance value of R1 and R2 will offset each other, resulting in Vrange being stable over temperature variations and process variations. In this way voltage operating range offsets due to process or temperature variations in the resistive components used in differential current signal circuit 110 are eliminated in response to voltage to differential current converter circuit 130 receiving tracking bias signal V9 from correction circuit 120.

Correction circuit 120 also provides set minimum operating voltage signal I7 to voltage to differential current converter circuit 130, as shown in FIG. 3 and FIG. 4. Correction circuit 120 generates set minimum operating voltage signal I7 in response to receiving correction input voltage V7, as shown in FIG. 10. Set minimum operating voltage transistor Q6 collector node 246 outputs set minimum operating voltage signal I7 in response to set minimum operating voltage transistor Q6 base node 242 receiving tracking bias signal V9. Set minimum operating voltage transistor Q6 emitter node 244 receives the supply voltage Vdd. Set minimum operating voltage transistor Q6 collector node 246 is coupled to first end I31 of converter resistor R1 as shown in FIG. 4 and FIG. 7. This circuit arrangement means that interim current signal I1 will be zero until voltage input signal V1 rises above the minimum operating voltage Vmin, where Vmin is given by $$V\min = \left(\frac{R1 * Vo}{R2}\right) * \frac{q6}{q3}, \quad (6)$$

where q6/q3 is the transistor emitter ratio of transistors Q6 and Q3. The minimum operating voltage Vmin of voltage to differential current converter circuit 130 is adjusted by adjusting I7, which is adjusted by adjusting the elements in equation 6. In this way correction circuit 120 outputs set minimum operating voltage signal I7 in response to receiving correction input voltage V7, where minimum operating voltage Vmin is adjusted in response to adjusting set minimum operating voltage signal I7. Providing set minimum operating voltage signal I7 to voltage to differential current converter circuit 130 allows the minimum operating voltage Vmin of voltage to differential current converter circuit 130 to be set at a level above zero, such that the operating range Vrange of voltage to differential current converter circuit 130 will be all positive values as shown in FIG. 5. This circuit arraignment also allows Vmin to be set a voltage value away from the voltage supply rails where nonlinear behavior sometimes occurs.

Additionally, set minimum operating voltage signal I7 will correct voltage offsets in minimum operating voltage Vmin for variations due to processing and temperature variations in the resistance value of converter resistor R1 and/or the resistance value of tracking bias resistor R2. Tracking bias resistor R2 will vary due to variations in process and temperature proportionally to converter resistor R1, because the two resistors are made by the same process. Therefore, variations in the resistance value of converter resistor R1 and tracking bias resistor R2 will cancel each other, allowing Vmin to remain stable over temperature and process variations. In this way variations in minimum operating voltage Vmin due to variations in the resistance value of converter resistor R1 or tracking bias resistor R2 from process and temperature variations are eliminated in response to voltage to differential current converter circuit 130 receiving set minimum operating voltage signal I7.

Converter circuit 120 can be implements using circuit elements other than those shown in the specific schematic example embodiments shown in FIG. 4 and FIG. 10. In some embodiments circuit elements different than those in the figures are used. In some embodiments connections or configurations different than those shown in the figures are used for correction circuit 120 according to the invention.

It is to be understood that differential current signal circuit 110 as shown in the specific schematic embodiments can be implemented in many different ways. Circuit elements other than those shown in the figures can be used. In some embodiments different types of transistors can be implemented. In some embodiments other integrated or discrete circuit elements are used. Differential current signal circuit 110 according to the invention can be embodied in many different specific circuit designs and implementations.

Figure 11:
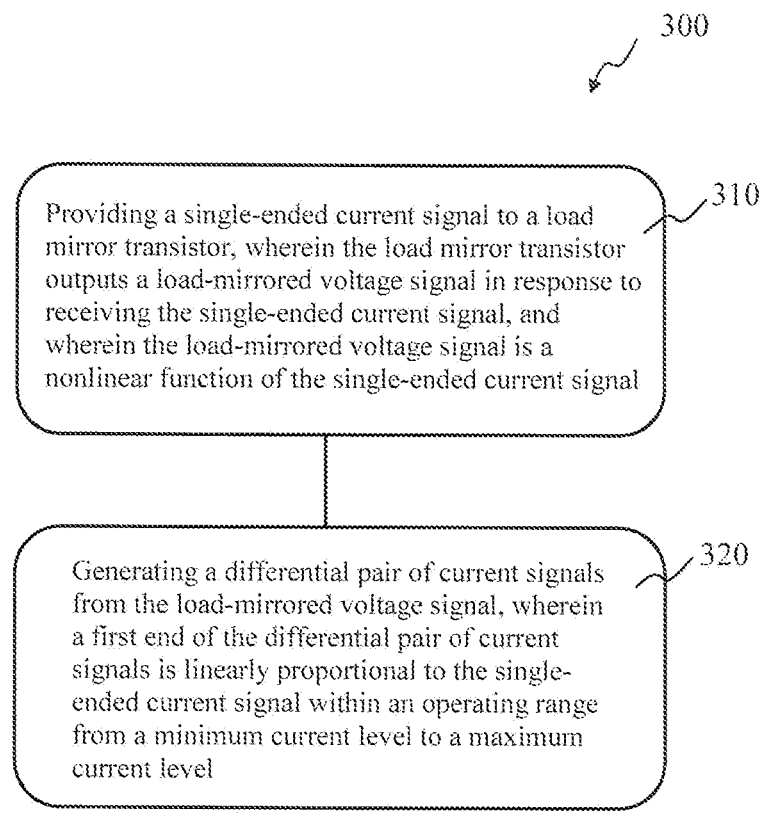
FIG. 11 illustrates method 300 of generating a differential pair of current output signals according to the invention.

FIG. 11 shows method 300 of generating a differential pair of current signals according to the invention. Method 300 includes step 310 providing a single-ended current signal to a load mirror transistor, wherein the load mirror transistor outputs a load-mirrored voltage signal in response to receiving the single-ended current signal, and wherein the load-mirrored voltage signal is a nonlinear function of the single-ended current signal. Step 310 can include many other steps. Method 300 also includes step 320 generating a differential pair of current signals from the load-mirrored voltage signal, wherein a first end of the differential pair of current signals is linearly proportional to the single-ended current signal within an operating range from a minimum current level to a maximum current level. In some embodiments the first end of the differential pair of current signals is linearly proportional to the single-ended current signal within an operating range from a minimum current level to a maximum current level in response to the impedance of the load mirror circuit being linearly proportional to the impedance of a load circuit as seen by the first end of the differential pair or current output signals. Step 320 can include many other steps.

Method 300 according to the invention can include many other steps. In some embodiments method 300 includes the step of providing the first end of the differential pair of current signals to a first load transistor, and the step of providing a second end of the differential pair of current signals to a second load transistor, wherein the first load transistor, the second load transistor, and the load mirror circuit have the same impedance.

In some embodiments method 300 according to the invention includes the step of generating the single-ended current signal with a voltage to single-ended current converter circuit, wherein the voltage to single-ended current converter circuit generates the single-ended current signal in response to receiving a voltage input signal, and wherein the single-ended current signal is linearly proportional to the voltage input signal within a voltage operating range from a minimum operating voltage to a maximum operating voltage. In some embodiment the voltage to single-ended current converter circuit includes a converter resistor. In some embodiments method 300 includes the step of generating a tracking bias signal with a correction circuit, where voltage offsets in the voltage operating range due to variations in the resistance value of the converter resistor are eliminated in response to the voltage to single-ended current converter circuit receiving the tracking bias signal. In some embodiment the correction circuit includes a tracking bias resistor, and the amplitude of the tracking bias signal is a function of the resistance value of the tracking bias resistor. In some embodiments the correction circuit outputs a set minimum operating voltage signal, and the minimum operating voltage of the voltage to single-ended current converter circuit is adjusted in response to adjustments to the set minimum operating voltage signal.

Figure 12:
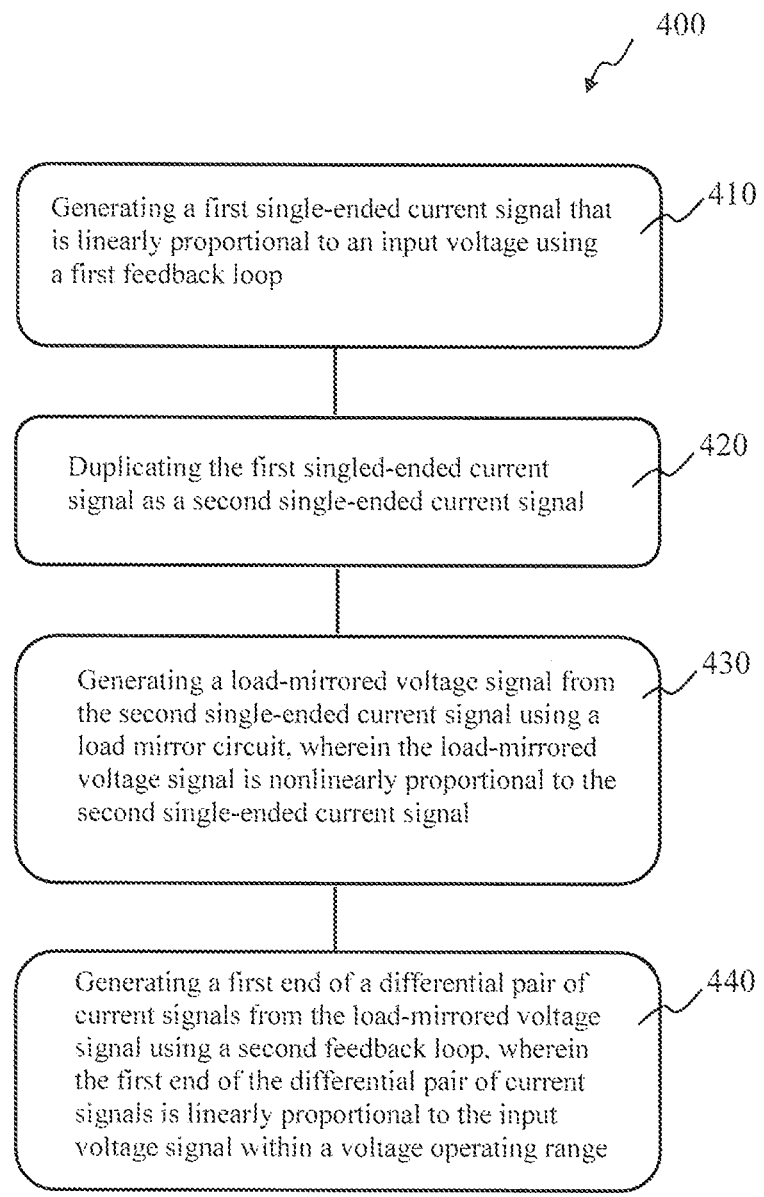
FIG. 12 illustrates method 400 of generating a differential pair of current output signals according to the invention.

FIG. 12 shows method 400 of generating a differential pair of current signals according to the invention. Method 400 of generating a differential pair of current signals includes step 410 generating a first single-ended current signal that is linearly proportional to a voltage input signal using a first feedback loop, and step 420 duplicating the first single-ended current signal to create a second single-ended current signal. Method 400 of generating a differential pair of current signals according to the invention also includes step 430 generating a load-mirrored voltage signal from the second single-ended current signal using a load mirror circuit, wherein the load-mirrored voltage signal is nonlinearly proportional to the second single-ended current signal. Method 400 according to the invention also includes step 440 of generating a first end of a differential pair of current signals from the load-mirrored voltage signal using a second feedback loop, where the first end of the differential pair of current signals is linearly proportional to the voltage input signal within a voltage operating range from a minimum operating voltage to a maximum operating voltage Method 400 can include many other steps, In some embodiments method 400 includes the step of generating a second end of the differential pair of current signals, wherein the second end of the differential pair of current signals has a phase that is shifted 180 degrees with respect to a phase of the first end of the differential pair of current signals In some embodiments method 400 includes the step of generating a set minimum operating voltage signal, wherein the minimum operating voltage is adjusted in response to adjusting the set minimum operating voltage signal. In some embodiments voltage offsets in the voltage operating range due to process or temperature variations are eliminated in response to the first feedback loop circuit receiving the set minimum operating voltage signal.

Step 420 can include many other steps. In some embodiments the second single-ended current signal is generated using a current replication transistor.

Step 430 generating a load-mirrored voltage signal from the second single-ended current signal using a load mirror circuit, wherein the load-mirrored voltage signal is nonlinearly proportional to the second single-ended current signal, can include many other steps. In some embodiments the load mirror circuit is a transistor, and the load-mirrored voltage signal is nonlinearly proportional to the single ended current signal. In some embodiments the impedance of the load mirror circuit is the same as the impedance of a first load transistor, wherein the first load transistor receives the first end of the differential pair of current signals.

It has been shown how voltage to differential current converter circuit 130 generates a differential pair of current output signals I3 and I4 in response to receiving a voltage input signal V1, where differential pair of current output signals I3 and I4 are linearly proportional to voltage input signal V1 within a voltage operating range Vrange from a minimum operating voltage Vmin to a maximum operating voltage Vmax. It has been shown how voltage to differential current converter circuit 130 provides a voltage operating range Vrange that provides linear output signals I3 and I4 over a wide range of voltage input signals V1. It has also been shown how implementing correction circuit 120 according to the invention in current signal source circuit 110 allows the elimination of voltage offsets in the voltage operating range from variations in the resistance value of converter resistor R1 and/or tracking bias resistor R2 that are used in the generation of differential pair of current output signals I3 and I4.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims.

The invention claimed is:

1. An electronic circuit comprising:
a voltage to single-ended current converter circuit, wherein the voltage to single-ended current converter circuit outputs a single-ended current signal in response to receiving a voltage input signal, and wherein the single-ended current signal is linearly proportional to the voltage input signal, and wherein the voltage to single-ended current converter circuit comprises:
a voltage to linear current feedback loop circuit, wherein the voltage to linear current feedback loop circuit generates an interim current signal in response to receiving the voltage input signal, and wherein the interim current signal is linearly proportional to the voltage input signal, and wherein the voltage to linear current feedback loop circuit generates a current replication voltage in response to receiving the voltage input signal;
and
a current replication transistor, wherein the current replication transistor generates the single-ended current signal in response to receiving the current replication voltage, wherein the single-ended current signal is linearly proportional to the voltage input signal;
and
a single-ended current to differential current converter circuit, wherein the single-ended current to differential current converter circuit outputs a differential pair of current output signals in response to receiving the single-ended current signal;
wherein the differential pair of current output signals are linearly proportional to the voltage input signal within a voltage operating range from a minimum operating voltage to a maximum operating voltage.

2. The electronic circuit of claim 1, wherein the current replication transistor comprises:
a current replication transistor source node, wherein the current replication transistor source node receives a supply voltage;
a current replication transistor gate node;
and
a current replication transistor drain node, wherein the current replication transistor drain node outputs the single-ended current signal in response to the current replication transistor gate node receiving the current replication voltage.

3. The electronic circuit of claim 1, wherein the voltage to linear current feedback circuit comprises:
a converter resistor;
a first feedback amplifier comprising:
a first feedback amplifier first input node, wherein the first feedback amplifier first input node receives the voltage input signal;
a first feedback amplifier second input node;
and
a first feedback amplifier output node;
and
a first feedback transistor comprising:
a first feedback transistor source node, wherein the first feedback transistor source node receives the supply voltage;
a first feedback transistor gate node, wherein the first feedback transistor gate node is coupled to the first feedback amplifier output node;
and
a first feedback transistor drain node, wherein the first feedback transistor drain node is coupled to a first end of the converter resistor and wherein the first feedback transistor drain node is coupled to the first feedback amplifier second input node;
wherein the first feedback amplifier output node outputs the current replication voltage in response to the first feedback amplifier first input node receiving the voltage input signal.

4. The electronic circuit of claim 1, further comprising a correction circuit, wherein the correction circuit outputs a set minimum operating voltage signal in response to receiving a correction input voltage, and wherein the minimum operating voltage is adjusted in response to adjusting the set minimum operating voltage signal.

5. The electronic circuit of claim 1, wherein the single-ended current to differential current converter circuit comprises:
a load minor transistor comprising:
a load minor transistor base node;
a load minor transistor collector node coupled to the load minor transistor base node;
and
a load minor transistor emitter node coupled to a current return path;

wherein the load mirror transistor base node outputs a load-mirrored voltage signal in response to the load mirror transistor collector node receiving the single-ended current signal;
and
a voltage to differential current converter circuit, wherein the voltage to differential current converter circuit outputs the differential pair of current output signals in response to receiving the load-mirrored voltage signal.

6. The electronic circuit of claim 5, wherein the differential pair of current output
signals are linearly proportional to the single-ended current signal over the voltage operating range in response to an impedance of the load minor transistor being linearly proportional to an impedance of a load receiving a first end of the differential pair of current output signals.

7. The electronic circuit of claim 6, wherein the voltage to differential current converter circuit comprises:
a second feedback amplifier comprising:
a second feedback amplifier first input node;
a second feedback amplifier second input node;
and
a second feedback amplifier output node, wherein the second feedback amplifier output node outputs a second feedback amplifier output signal in response to the second feedback amplifier first input node receiving the load-mirrored voltage signal;
and
a source-coupled amplifier circuit, wherein the source-coupled amplifier circuit outputs the differential pair of current output signals in response to receiving the second feedback amplifier output signal.

8. A method of generating a differential pair of current signals comprising:
providing a single-ended current signal to a load mirror circuit, wherein the load minor circuit outputs a load-mirrored voltage signal in response to receiving the single-ended current signal, and wherein the load-mirrored voltage signal is a nonlinear function of the single-ended current signal;
and
generating the differential pair of current signals from the load-mirrored voltage signal, wherein a first end of the differential pair of current signals is linearly proportional to the single-ended current signal within an operating range from a minimum current level to a maximum current level.

9. The method of claim 8 wherein the first end of the differential pair of current signals is linearly proportional to the single-ended current signal within the operating range from the minimum current level to the maximum current level in response to an impedance of the load mirror circuit being linearly proportional to an impedance of a load circuit as seen by the first end of the differential pair of current signals.

10. The method of claim 8 further comprising:
providing the first end of the differential pair of current signals to a first load transistor;
and
providing a second end of the differential pair of current signals to a second load transistor, wherein the first load transistor, the second load transistor, and the load minor circuit have the same impedance.

11. The method of claim 8 further comprising:
generating the single-ended current signal with a voltage to single-ended current converter circuit, wherein the voltage to single-ended current converter circuit generates the single-ended current signal in response to receiving a voltage input signal, and wherein the single-ended current signal is linearly proportional to the voltage input signal within a voltage operating range from a minimum operating voltage to a maximum operating voltage.

12. The method of claim 11 further comprising generating a tracking bias signal with a correction circuit, wherein voltage offsets in the voltage operating range are eliminated in response to the voltage to single-ended current converter circuit receiving the tracking bias signal.

13. The method of claim 12, wherein the correction circuit further comprises a tracking bias resistor, wherein the amplitude of the tracking bias signal is a function of the resistance value of the tracking bias resistor.

14. The method of claim 11, wherein the correction circuit outputs a set minimum operating voltage signal, and wherein the minimum operating voltage of the voltage to single-ended current converter circuit is adjusted in response to adjustments to the set minimum operating voltage signal.

15. A method of generating a differential pair of current signals comprising:
generating a first single-ended current signal that is linearly proportional to a voltage input signal using a first feedback loop;
duplicating the first single-ended current signal to create a second single-ended current signal;
generating a load-mirrored voltage signal from the second single-ended current signal using a load mirror circuit, wherein the load-mirrored voltage signal is nonlinearly proportional to the second single-ended current signal;
and
generating a first end of the differential pair of current signals from the load-mirrored voltage signal using a second feedback loop, wherein the first end of the differential pair of current signals is linearly proportional to the voltage input signal within a voltage operating range from a minimum operating voltage to a maximum operating voltage.

16. The method of claim 15, wherein the impedance of the load mirror circuit is the same as the impedance of a first load transistor, and wherein the first load transistor receives the first end of the differential pair of current signals.

17. The method of claim 15 further comprising generating a second end of the differential pair of current signals, wherein the second end of the differential pair of current signals has a phase that is shifted 180 degrees with respect to a phase of the first end of the differential pair of current signals.

18. The method of claim 15, further comprising generating a set minimum operating voltage signal, wherein the minimum operating voltage is adjusted in response to adjusting the set minimum operating voltage signal.

19. The method of claim 18, wherein the first feedback loop comprises a converter resistor, and wherein variations in the minimum operating voltage due to variations in the resistance value of the converter resistor are eliminated in response to the first feedback loop circuit receiving the set minimum operating voltage signal.

20. An electronic circuit comprising:
a load minor circuit, wherein the load mirror circuit converts a single-ended current signal into a load-mirrored voltage signal according to a current-to-voltage transfer function;
and
a voltage to differential current converter circuit, wherein the voltage to differential current converter circuit converts the load-mirrored voltage signal to a first end of a differential pair of current output signals according to a voltage-to-current transfer function, wherein the voltage-to-current transfer function is inversely proportional to the current-to-voltage transfer function.

21. The circuit of claim 20, wherein the current-to-voltage transfer function is nonlinear.

22. The circuit of claim 21, wherein the first end of the differential pair of current signals is linearly proportional to the single-ended current signal.

23. The circuit of claim 22, wherein the voltage to differential current converter circuit converts the load-mirrored voltage signal into a second end of the differential pair of current signals, wherein the second end of the differential pair of current signals has a phase that is shifted 180 degrees from a phase of the first end of the differential pair of current signals.

24. The circuit of claim 23, further comprising a voltage to single-ended current converter circuit, wherein the voltage to single-ended current converter circuit comprises:

a voltage to linear current feedback loop circuit, wherein the voltage to linear current feedback loop circuit generates an interim current signal in response to receiving a voltage input signal, and wherein the interim current signal is linearly proportional to the voltage input signal, and wherein the voltage to linear current feedback loop circuit generates a current replication voltage in response to receiving the voltage input signal; and a current replication transistor, wherein the current replication transistor generates the single-ended current signal in response to receiving the current replication voltage, wherein the single-ended current signal is linearly proportional to the voltage input signal.

* * * * *